(12) United States Patent
Forejt

(10) Patent No.: US 6,617,921 B2
(45) Date of Patent: Sep. 9, 2003

(54) HIGH OUTPUT SWING COMPARATOR STAGE

(75) Inventor: Brett E. Forejt, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/988,474

(22) Filed: Nov. 20, 2001

(65) Prior Publication Data

US 2002/0060607 A1 May 23, 2002

Related U.S. Application Data

(60) Provisional application No. 60/252,172, filed on Nov. 20, 2000.

(51) Int. Cl.[7] .................................................. H03F 3/45
(52) U.S. Cl. ........................ 330/253; 330/255; 330/258
(58) Field of Search ................................. 330/253, 255, 330/258

(56) References Cited

U.S. PATENT DOCUMENTS

| 4,958,133 A | * | 9/1990 | Bazes | 330/253 |
|---|---|---|---|---|
| 5,142,244 A | * | 8/1992 | Glica et al. | 330/253 |
| 5,381,112 A | * | 1/1995 | Rybicki et al. | 330/253 |
| 5,475,339 A | * | 12/1995 | Maida | 327/561 |
| 5,808,513 A | * | 9/1998 | Archer | 330/253 |
| 5,880,637 A | * | 3/1999 | Gonzalez | 330/253 |
| 6,114,874 A | * | 9/2000 | Bales | 326/66 |
| 6,281,753 B1 | * | 8/2001 | Corsi et al. | 330/261 |

OTHER PUBLICATIONS

Baker, Bonnie C., "What Does 'Rail-to-Rail' Output Really Mean?", www.chipcenter.com, Analog Avenue, Tech Notes, pp. 1–4 (no date).

* cited by examiner

Primary Examiner—Michael Tokar
Assistant Examiner—Linh Van Nguyen
(74) Attorney, Agent, or Firm—J. Dennis Moore; W. James Brady, III; Frederick J. Telecky, Jr.

(57) ABSTRACT

A circuit and method is provided that provides an amplification stage to a comparator device that matches transistor transconductances to provide adequate amplification and employs diode coupled transistors to control the common mode output bias voltage. The circuit and method provides for a high gain comparator stage with control over output common mode voltage, while providing rail to rail output swing during differential mode without an external feedback to the comparator device.

17 Claims, 6 Drawing Sheets

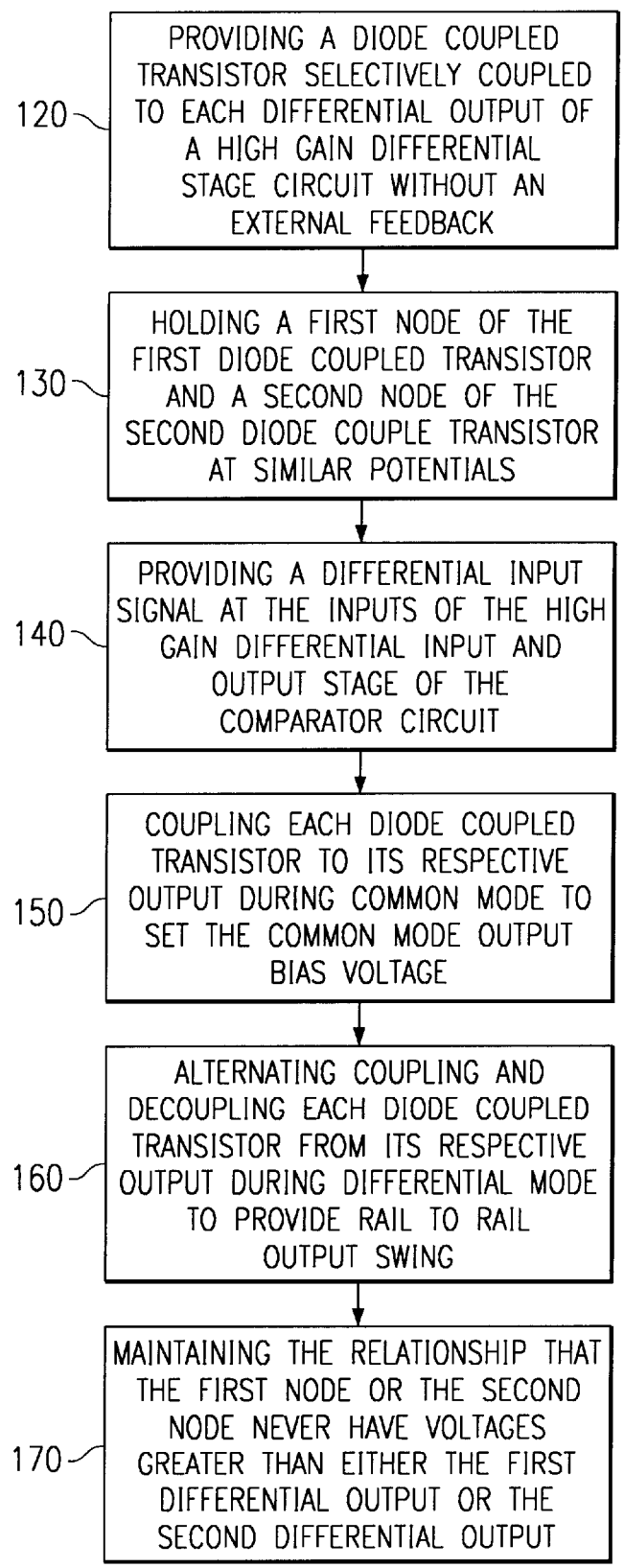

HIGH OUTPUT SWING COMPARATOR STAGE

This application claims priority under 35 USC §119(e)(1) of provisional application Ser. No. 60/252,172, filed Nov. 20, 2000.

TECHNICAL FIELD

The present invention relates to electrical circuits, and more particularly to a circuit and method for providing a high output swing and high gain to an amplification stage with build in common mode feedback for a comparator circuit.

BACKGROUND OF THE INVENTION

Typically, the design of a controlled gain, open loop comparator circuit inherently limits the output swing range. Controlled gain stages are selected due to their inherent common mode feedback. Recently, there has been a development in providing comparator circuits that allows both high gain and high output swing as well as inherent common mode feedback. These match transconductance (width to length ratio, i.e., W/L, where W is the channel width of the transistor and L is the channel length thereof) of transistor devices in order to provide a low offset across process voltage and temperature variations. In order to keep the input referred offset voltage small, the transistors are sized to substantially match transconductances with one another when in the quiescent condition. However, this creates a problem with input capacitance. Since the comparator stages are AC coupled, the input capacitance of a stage creates a capacitive divider between the output of the previous stage and that stage. This capacitive divider reduces the gain and performance of the comparator. Increasing the size of the coupling capacitors slows down the system. Increasing the current in the amplifiers to compensate requires increased power and area. Furthermore, a gain increase in the comparator is irrelevant if the gain is already enough to saturate the output of the stage. The comparator is designed so that the smallest specified input would saturate its output.

Another problem is that comparator stages that have controlled gain and that match transconductances with one another have a fundamental limitation, the output swing. A typical solution is to employ a differential input/output stage that utilizes a pair of diode connected transistors to provide control of the gain. This has the added benefit of eliminating the need for a common mode feedback loop. However, this reduces the output swing of the stage to approximately a diode drop in single ended configurations and two diode drops in differential configurations. In low power, low voltage analog-to-digital converter designs the comparator voltage swing is an important issue. The first stage sets the noise and offset for the entire system. If the input referred offset voltage is large and the gain of the stage is high enough, the output of the comparator may be saturated to the point where the sign of the output voltage is fixed no matter what the input voltage. With increased output swing, the amount of input referred offset needed to saturate the output of the comparator increases proportionally.

FIG. 1a illustrates a prior art fixed gain amplification state 10 of a comparator circuit. The stage includes a first differential input INM coupled to a gate of a first nmos input transistor 36 and a second differential input INP coupled to a gate of a second nmos input transistor 37. The first and second input transistors 36 and 37 have drains coupled to an active load positive feedback circuit portion 14 comprised of pmos transistors 32 and 33. A first current mirror 12 comprised of pmos transistors 30, 31 and 32 are coupled to the active load positive feedback portion 14 on a first end and a first differential output OUTM on a second end. The current through transistor 30 is proportional t the sum of the currents through transistors 31 and 32. A second current mirror 16 comprised of pmos transistors 33, 34 and 35 are coupled to the active load positive feedback circuit portion 14 on a first end and a second differential output OUTP on a second end. The current through transistor 35 is proportional to the sum of the currents through transistors 33 and 34. Transistors 30, 31, 32, 33, 34 and 35 all have sources coupled to VDD.

The first and second input transistors 36 and 37 have sources coupled to one another to form a node V1. The sources of the first and second input transistors 36 and 37 are also coupled to a current source portion 22 comprised of nmos transistors 42 and 43. A second positive feedback portion 20 comprised of nmos transistor 41 has its gate coupled to the second differential output OUTP and its drain coupled to the first differential output OUTM. A first diode connected portion 18 comprised of nmos transistor 40 has its drain and its gate coupled to OUTM. A third positive feedback portion 24 comprised of nmos transistor 44 has its gate coupled to the first differential output OUTM and its drain coupled to the second differential output OUTP. A second diode connected portion 26 comprised of nmos transistor 45 has its drain and its gate coupled to OUTP. Power transistors 38 and 39 are coupled to a power device signal PD and a bias current signal IB, respectively, and provide input bias current and voltage to the current source portion 22. Transistors 38, 39, 40, 41, 42, 43, 44 and 45 all have sources coupled to VSS.

The main function of the devices 31 and 34 are to set the common mode voltages of nodes V2 and V3. Transistors 31 and 34 are connected as diodes and have a certain set DC current flowing through the transistors 31 and 34 in the quiescent stage. The transistors 31 and 34 also provide enough negative feedback to stabilize the positive feedback of the active load portion 14. The diode connected transistors 40 and 45 set the quiescent common mode voltage of OUTP and OUTM. During differential mode the diode connected transistors 40 and 45 have the detrimental effect of limiting the output swing to two times a $V_t$ plus a $V_{dsat}$ regardless of the voltage difference across VDD to VSS. FIG. 1b is a graph 48 of voltage versus time illustrating the voltage swing limitation of the differential output (VOUT) of the prior art stage 10 with a given differential input.

In view of the above, it is apparent that there is potential for improvements in the above amplification stage of the prior art device.

SUMMARY OF THE INVENTION

In one aspect of the present invention, a circuit and method are provided to obtain a high output swing and high gain amplification stage with built in common mode feedback for a comparator device. The present circuit and method provides for an improved amplification stage to a comparator circuit without an external feedback loop. The amplification stage exhibits control over output common mode voltage, while also providing approximately rail to rail output swing. The amplification stage provides for differential outputs with low impedance during common mode and high impedance during differential mode by selectively switching out of the circuit the diode connected transistors used for setting the offset voltage during common mode when the circuit is in differential mode.

In one aspect of the invention, the amplification stage of the circuit is provided with a first current mirror transistor coupled between a first differential output and a voltage source and a transistor selectively coupleable as a diode or as a current source. A first switch is disposed between the selectively coupleable transistor's gate and the first differential output and a second switch is disposed between the selectively coupleable transistor's gate and the second differential output. The first and second switches have a first state for setting the selectively coupleable transistor as a diode for selling the common mode bias voltage on its respective differential output and a second state for setting the selectively coupleable transistor as a current source which provides the outputs with high impedance during differential mode.

Thus, according to another aspect of the present invention, a first node is formed between a gate of the first diode coupled transistor and the first switch and a second node is formed between a gate of the second diode coupled transistor and the second node. A resistive element is provided coupling the first node to the second node for holding the first and second node at the same potential during operation.

Yet another aspect of the invention relates to a first level shifter and comparator circuit coupled to the first node and a second level shifter and comparator circuit coupled to the second node. The first and second level shifter and comparator circuits are adapted to prohibit both the first node and the second node from being one of above a voltage of both the first and second differential outputs.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

BRIEF DESCRIPTION OF THE DRAWINGS

FIG. 5 illustrates a flow chart of one particular methodology of amplifying a differential input within a comparator circuit in accordance with one aspect of the present invention.

DETAILED DESCRIPTION OF THE INVENTION

The present invention will now be described with respect to the accompanying drawings in which like numbered elements represent like parts. The present invention will be described with reference to a circuit and a method of providing an amplification stage to a comparator device without a common mode feedback loop. The amplification stage provides for matching transistor transconductances to provide adequate amplification and employs diode coupled transistors to control the common mode output bias voltage of the stage. The present circuit and method provides for a high gain comparator stage with control over output common mode voltage with rail to rail output swing. The present circuit and method employs a first and second common mode setting portions. The first and second common mode setting portions are operable to set the bias voltage and a low output impedance during common mode of the comparator, and provide rail to rail output swing and a high impedance during differential mode. It should be understood that the description below is merely illustrative and that they should not be construed in a limiting sense.

Figure 1A:
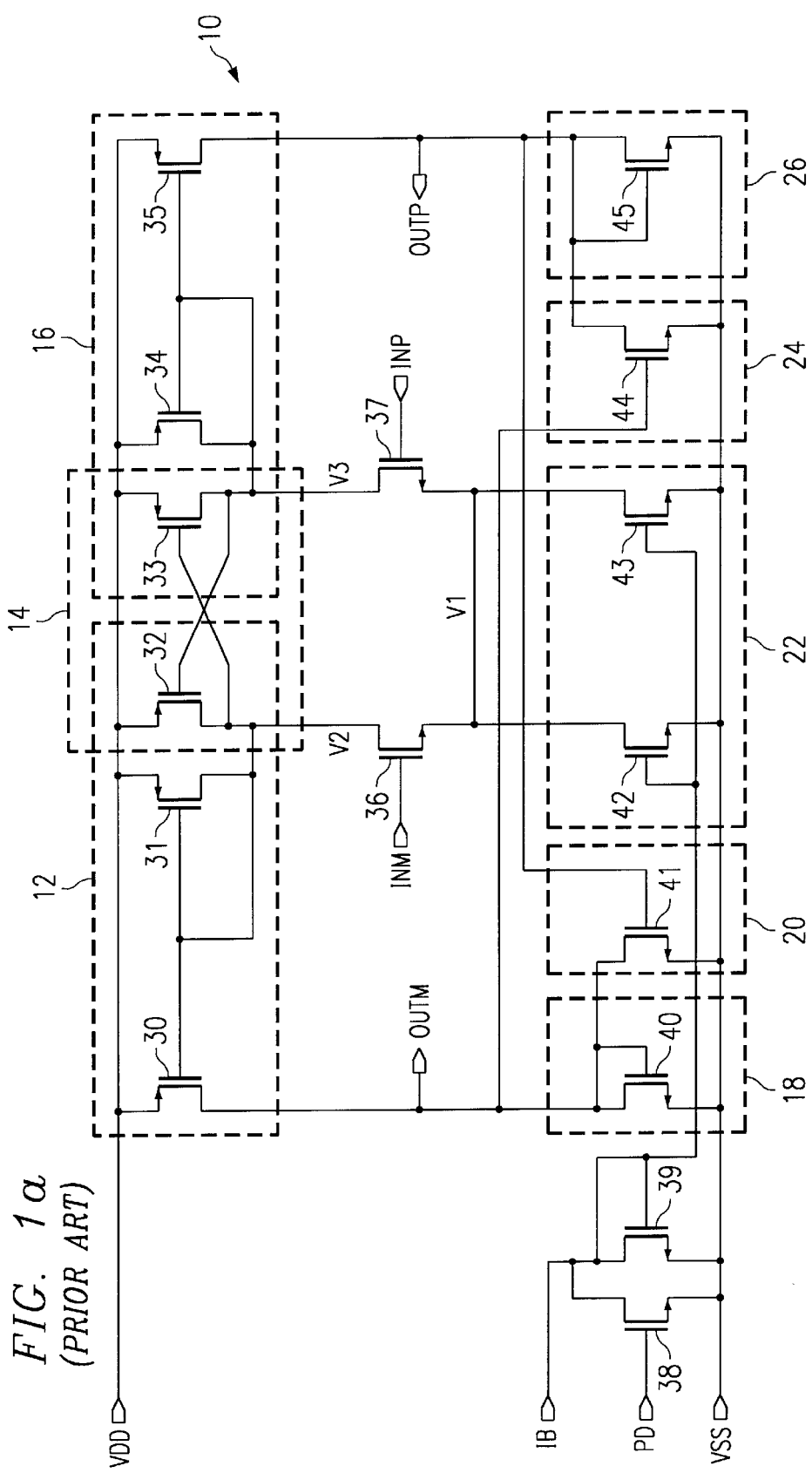
FIG. 1a illustrates a schematic diagram of an amplification stage of a comparator device in accordance with the prior art.
Figure 1B:
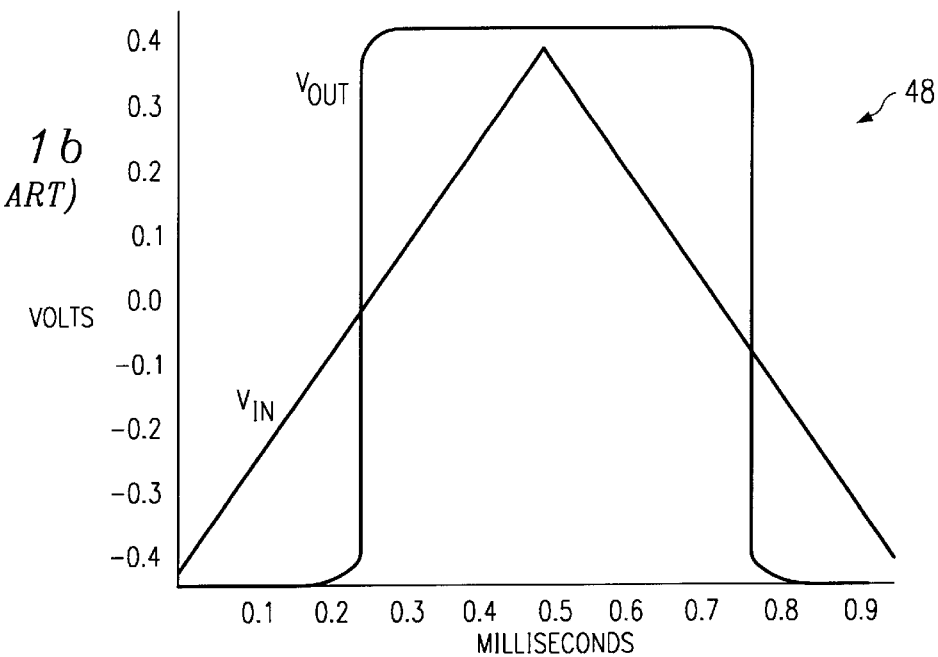
FIG. 1b illustrates a graph of the differential input voltage and differential output voltage versus time of the stage of FIG. 1b in accordance with the prior art.
Figure 2B:
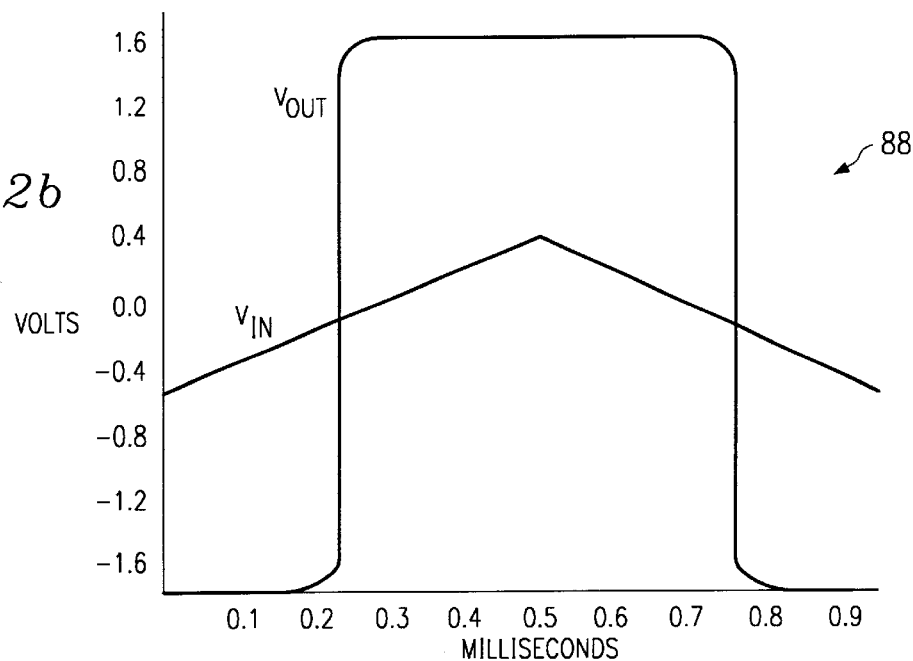
FIG. 2b illustrates a graph of the differential input voltage and differential output voltage versus time of the stage of FIG. 2a in accordance with the present invention.
Figure 2A:
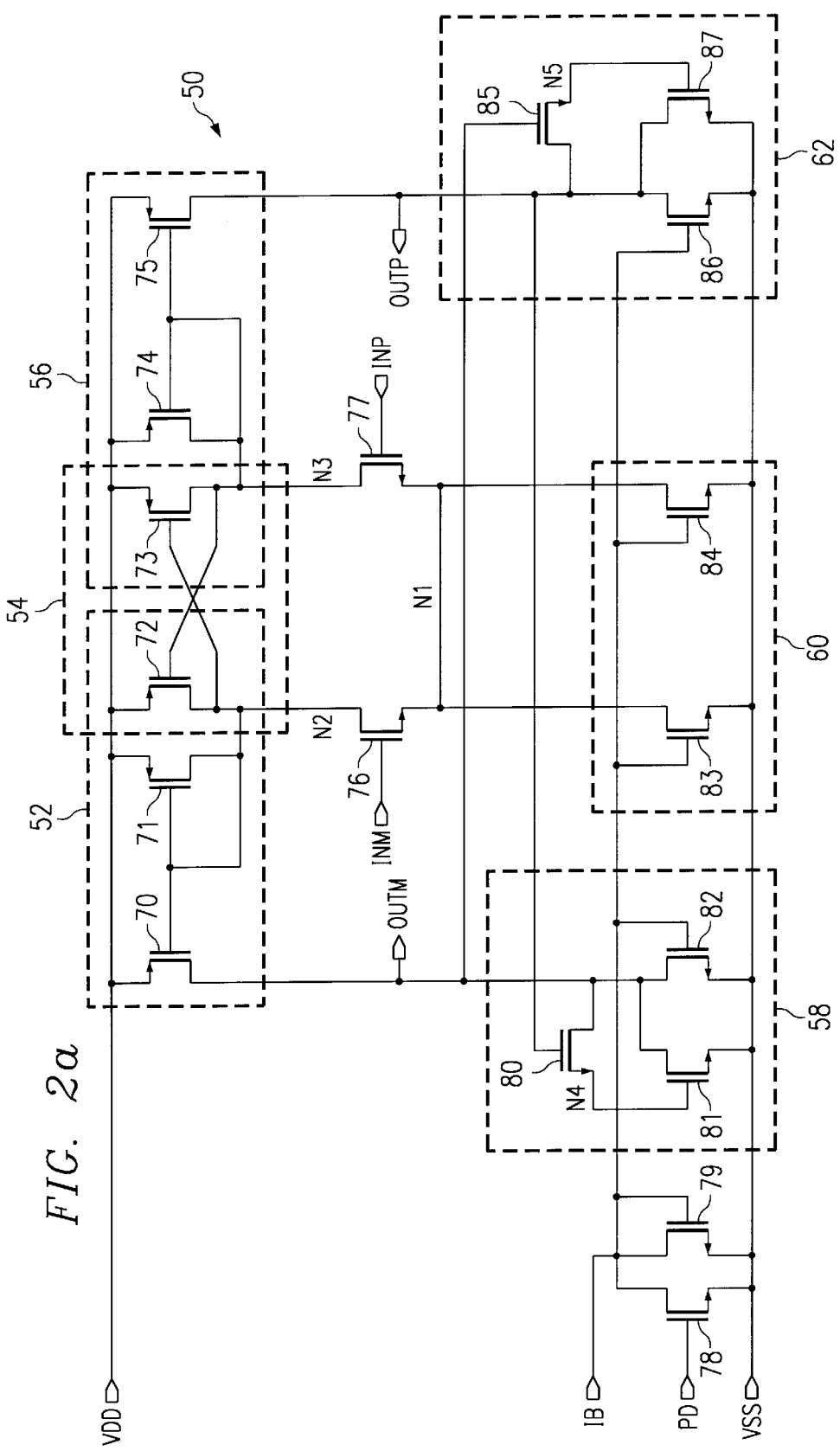
FIG. 2a illustrates a schematic diagram of an amplification stage of a comparator device in accordance with one aspect of the present invention.

FIG. 2a illustrates an amplification stage 50 to a comparator circuit without an external feedback mechanism. The stage 50 has a first differential input INM coupled to a gate of a first nmos input transistor 76 and a second differential input INP coupled to gate of a second nmos input transistor 77. The first and second input transistors 76 and 77 have drains coupled to an active load positive feedback portion 54 comprised of pmos transistors 72 and 73. A first current mirror 52 comprised of pmos transistors 70, 71 and 72 are coupled to the active load positive feedback portion 54 on a first end and a first differential output OUTM on a second end. The current through transistor 70 is proportional to the sum of the currents through the transistors 71 and 72. A second current mirror 56 comprised of pmos transistors 73, 74 and 75 are coupled to the active load positive feedback portion 54 on a first end and a second differential output OUTP on a second end. The current through transistor 75 is proportional to the sum of the currents through the transistors 73 and 74. Transistors 70, 71, 72, 73, 74 and 75 all have sources coupled to VDD.

The first and second input transistors 76 and 77 have sources coupled to one another to form a node N1. The sources of the first and second input transistors are also coupled to a current source portion 60 comprised of nmos transistors 83 and 84. High gain comparator, for example, stage 50 has a gain of about 50 db. The main function of the transistors 71 and 74 are to set the common mode voltages of nodes N2 and N3. Transistors 71 and 74 are connected as diodes and have a certain set DC current flowing through the transistors 71 and 74 in the quiescent stage. The transistors 71 and 74 also provide enough negative feedback to stabilize the positive feedback of the active load portion 54. A first common mode setting portion 58 is provided that includes transistors 80, 81 and 82 and a second common mode setting portion 62 is provided that includes transistors 85, 86 and 87. Power transistors 78 and 79 are coupled to a power device signal PD and a bias current signal IB, respectively, and provide input bias current and voltage to the current source portion 60. Transistors 78, 79, 80, 81, 82, 83, 84, 86 and 87 all have sources coupled to VSS.

Transistors 80 and 85 are switches that are coupled between the gate and drain of the diode connected transistors 81 and 87, respectively. This provides a selectively coupleable diode connected transistor. The switches 80 and 85 allow the stage 50 to operate in a similar fashion as the prior art device during common mode, while also providing rail to rail voltage swing at the output nodes OUTP and OUTM during the differential mode. For example, during quiescent conditions switch 80 and 85 are turned on, which couples the gate and drain of transistors 81 and 87 together, respectively, thus turning transistor 81 and 87 into diode connected transistors. This sets the bias voltage of OUTP and OUTM during common mode.

During differential operation, however, where OUTP goes high and OUTM goes low in response to a differential input at INP and INM, transistor 80 turns on, transistor 70 turns off, and transistor 82 turns on, acting as a current source, pulls OUTM towards VSS. Additionally, transistor 85 turns off which changes the diode connected transistor 87 from a diode to a current source connected to OUTP, thereby providing a very high output impedance at OUTP. Transistor 75 can then pull OUTP very close to VDD. The positive feedback portions of the prior art design are replaced with the current source 82 and a current source 86, which essentially replace the low impedance diode coupled transistors 81 and 87 with high impedance current sources when the diode connected transistors 81 and 87 are decoupled by switches 80 and 85, respectively. Therefore the circuit 50 improves the output swing in the differential mode by selectively removing the diode connected transistor from the differential output which is going high and replacing the diode connected transistor with a current source, thereby increasing the output impedance thereat and facilitating the output node increasing approximately to the VDD rail voltage.

FIG. 2b is a graph 88 of voltage versus time illustrating the differential output swing of the improved stage 50. As illustrated in FIG. 2b, the output swing has been increased to ±1.7V (with a difference 1.8V between VDD and VSS) as opposed to the prior art device which was limited to an output swing of ±0.46V.

Figure 3:
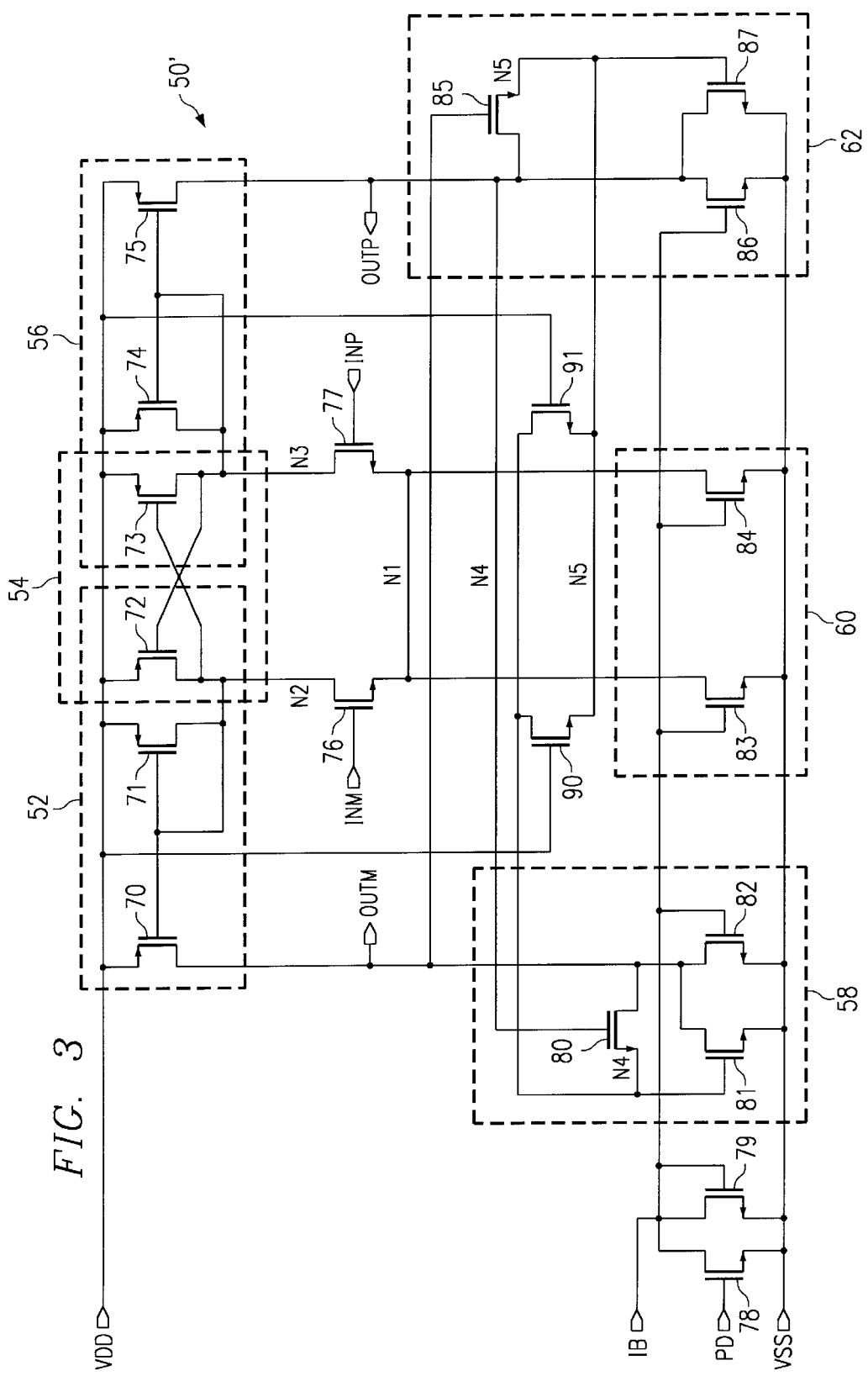
FIG. 3 illustrates a schematic diagram of an improved amplification stage of a comparator device in accordance with another aspect of the present invention.

FIG. 3 illustrates an additional improvement to the stage 50 of FIG. 2a. As can be seen from FIG. 2a, node N4 and node N5 are floating when transistors 80 and 85 are off, respectively. Furthermore, the reverse bias diode leakage current from the source of transistors 80 and 85 to the substrate can cause nodes N4 and N5 to be unstable with respect to holding their voltage values. The instability can cause some hysteresis in the stage 50. A stage 50' as shown in FIG. 3, for example, is provided that allows for substantial control of nodes N4 and N5 when either of transistors 80 or 85 are in an off state. In order to accomplish this, shorting transistors 90 and 91 are connected in parallel with one another with sources coupled to node N5, drains coupled to node N4 and gates coupled to VDD. When OUTP swings high and OUTM swings low, transistor 85 turns off and transistor 80 turns fully on. The shorting transistors 90 and 91 now hold node N4 and node N5 at substantially similar potentials. Additionally, when OUTP goes low and OUTM goes high, the shorting transistors 90 and 91, again hold node N5 and node N4 at substantially similar potentials. Therefore, the nodes N4 and N5 are controlled during all stage conditions thereby eliminating the undesirable hysteresis.

Figure 4:
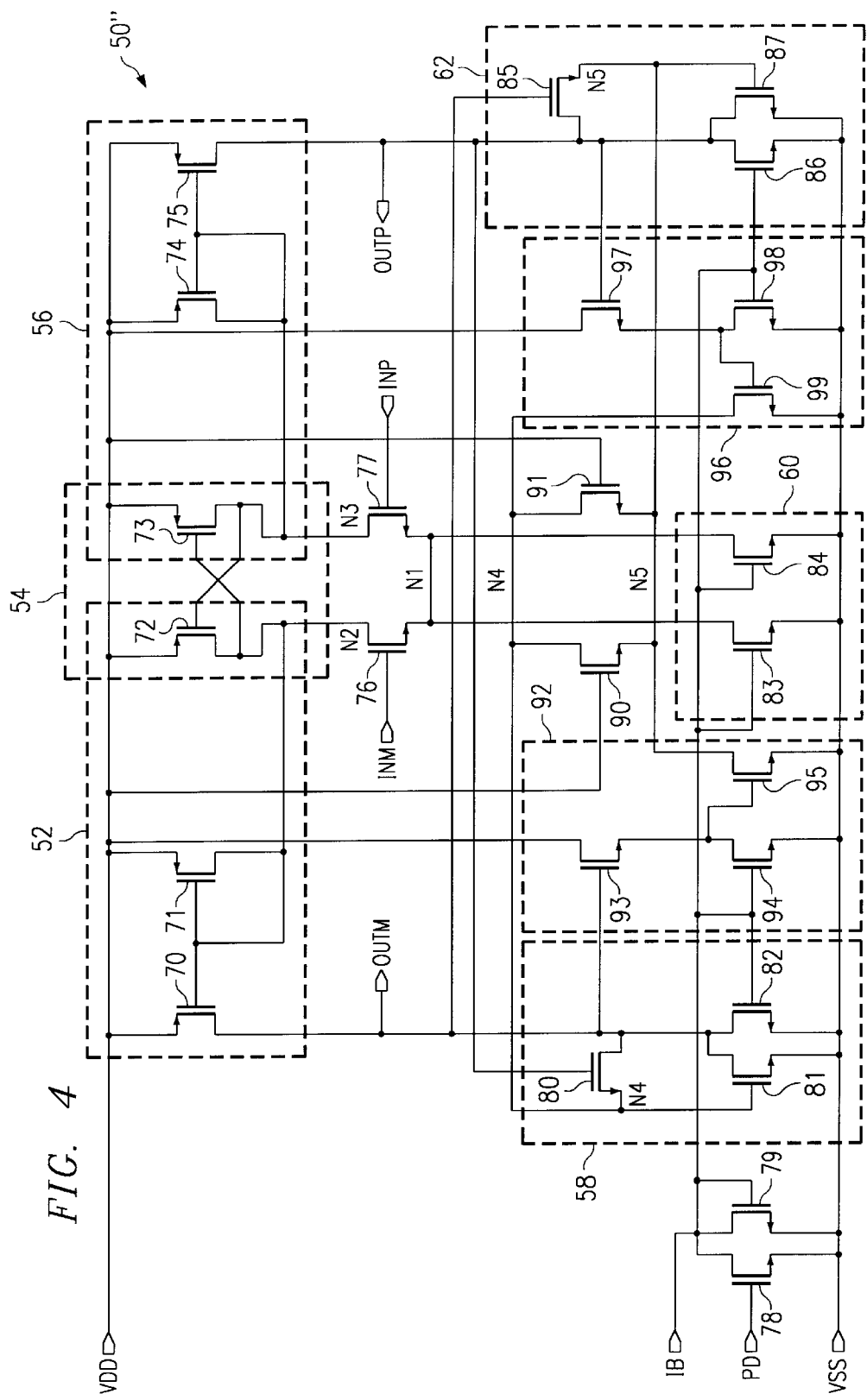
FIG. 4 illustrates a schematic diagram of another improved amplification stage of a comparator device in accordance with yet another aspect of the present invention.

FIG. 4 illustrates a further improvement to the stage 50' of FIG. 3. A stage 50" is provided that solves yet another potential problem that may occur with the stage 50. For example, if the nodes N4 and N5 ever rise above either of the output voltages, then there is a potential for the output voltages to latch into a state where the both output voltages (OUTP and OUTM) are 0 volts. This may occur because the transistors 81 and 87 are not controlled and may have the potential of flowing more current than intended. The stage 50" includes a first level shift and comparator portion 92 comprised of transistors 93, 94 and 95 and a second level shift and comparator portion 96 comprised of transistors 97, 98 and 99. Transistors 93 and 94 form a first level shifter circuit and transistor 95 forms a simple first comparator. Additionally, transistors 97 and 98 form a second level shifter circuit, while transistor 99 forms a simple second comparator circuit. Transistors 93 and 94 form a level shifter from OUTM to the gate of transistor 95 and transistor 97 and 98 form a level shifter from OUTP to the gate of transistor 99. If the output voltage falls below one of the nodes N4 or N5, the respective level shifter and comparator circuit will turn on preventing the stage from latching into the unwanted state.

The operation of the simple comparator is as such, if the node N5 rises above the node OUTM, the transistor 95 turns on and pulls node N5 to VSS. Similarly if N4 rises above the node OUTP, the transistor 99 turns on and pulls node N4 to VSS. The level shifter is needed due to the threshold voltage of transistors 95 and 99. If the level shifter were not present, the comparator would not trigger until N4 or N5 were a threshold voltage above OUTP or OUTM respectively. The level shifter subtracts the threshold voltage of transistor 93 from the trigger point of transistor 95. Since the threshold voltage of transistor 93 is similar or greater than that of transistor 95 (likewise with transistors 97 and 99) due to body bias on transistor 93, the trip point of transistor 95 (and 99) is below the point at which the unwanted state may occur.

FIG. 5 is a flow diagram representing an amplification methodology of a signal through a high gain amplification stage of a comparator circuit in accordance with another aspect of the present invention. While, for purposes of simplicity of explanation, the methodology of FIG. 5 is shown and described as a series of steps, it is to be understood and appreciated that the present invention is not limited to the order of steps, as some steps may, in accordance with the present invention, occur in different orders and/or concurrently with other steps from that shown and described herein. For example, a methodology in accordance with an aspect of the present invention may be represented as a combination of various states (e.g., in a state diagram). Moreover, not all illustrated steps may be required to implement a methodology in accordance with an aspect the present invention.

FIG. 5 is a flow diagram illustrating one particular methodology of amplification of a differential signal in a comparator circuit according to the present invention. At step 120, a first and a second diode coupled transistor is provided being selectively coupleable to a first and second differential output, respectively, of a high gain differential input and output stage of a comparator circuit. At step 130, a first node of the first diode coupled transistor and a second node of the second diode coupled transistor is coupled to one another via, for example, a resistive element to be held at substantially similar potentials during operation. Step 130 operates to minimize instability and hysteresis associated therewith.

At step 140, a differential signal is provided at the inputs of the high gain differential stage of the comparator circuit. At step 150, each diode coupled transistor is coupled to its respective output during common mode to set the common mode differential output bias voltage. At step 160, each diode coupled transistor is alternated between a coupled and decoupled from its respective differential output during differential mode to provide rail to rail voltage swing between two differential outputs. At step 170, the relationship is maintained of the first node and the second node never having voltages greater than either the first differential output or the second differential output.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising."

What is claimed is:

1. A high gain differential input and output stage circuit for a comparator device comprising:
   a first common mode setting portion coupled to a first differential output; and
   a second common mode setting portion coupled to a second differential output;
   wherein the first and second common mode setting portions have a first state in which the first and second common mode setting portions are coupled to the respective differential outputs for setting the common mode bias output voltage of the stage during a common mode condition and a second state in which the first and second common mode setting portions allow the respective differential outputs to swing rail to rail during a differential mode condition;
   the first common mode setting portion comprising a first diode coupled transistor selectively coupleable to the first differential output and the second common mode setting portion comprising a second diode coupled transistor selectively coupleable to a second differential output;
   the first common mode setting portion further comprising a first switch provided for selectively coupling the first differential output to the second diode coupled transistor and the second common mode setting portion further comprising a second switch provided for selectively coupling the second differential output to the second diode coupled transistor, the first switch being a transistor disposed between a drain and a gate of the first diode coupled transistor and the second switch being a transistor disposed between a drain and a gate of the second diode coupled transistor.

2. The circuit of claim 1, the transistor of the first switch having a source coupled to the gate of the first diode coupled transistor forming a first node and a gate coupled to the second differential output and the transistor of the second switch having a source coupled to the gate of the second diode coupled transistor forming a second node and a gate coupled to the first differential output.

3. The circuit of claim 2, further comprising at least one transistor coupled between the first node and the second node for holding the first node and the second node at substantially similar potentials.

4. The circuit of claim 3, further comprising a first level shifter and comparator circuit coupled to the first common mode setting portion and a second level shifter and comparator circuit coupled to the second common mode setting portion, the first and second level shifter and comparator circuits adapted to prohibit both the first node or the second node from being above a voltage of either the first and second differential outputs.

5. A method for controlling common mode voltage in a high gain differential stage circuit for a comparator device without an external feedback, comprising the steps of:
   providing a first diode coupled transistor selectively coupleable to a first differential output and a second diode coupled transistor selectively coupleable to a second differential output;
   coupling the first diode coupled transistor to the first differential output and coupling the second diode coupled transistor to the second differential output during common mode of the stage circuit; and
   alternating coupling and decoupling the first diode coupled transistor from the first differential output and the second diode coupled transistor from the second differential output during differential mode of the stage circuit, while providing a high impedance in place of the respective diode coupled transistor when it is decoupled.

6. The method of claim 5, the step of providing a first diode coupled transistor selectively coupleable to a first differential output and a second diode coupled transistor selectively coupleable to a second differential output further comprising the step of providing a first switch between a gate of the first diode coupled transistor and the first differential output and a second switch between a gate of the second diode coupled transistor and the second differential output wherein the gate of the first diode coupled transistor forms a first node and the gate of the second diode coupled transistor forms a second node.

7. The method of claim 6, further comprising the step of holding the first node and the second node at substantially similar potentials.

8. The method of claim 7, the step of holding the first node and the second node at substantially similar potentials comprising providing at least one transistor between the first and the second nodes.

9. A high gain differential input and output stage circuit for a comparator device without an external feedback, comprising:
   a first diode coupled transistor selectively coupleable to a first differential output; and
   a second diode coupled transistor selectively coupleable to a second differential output;
   wherein the first and second diode coupled transistors have a first state coupled to the respective differential outputs for setting the common mode bias output voltage of the stage and a second state alternating between a coupled and a decoupled state from the respective differential outputs, with a high impedance being provided in place of the respective diode coupled transistor when it is decoupled, for allowing rail to rail output swing during differential mode.

10. The circuit of claim 9, wherein the first and second differential outputs have a low impedance in the first state and a high impedance in the second state.

11. The circuit of claim 9, further comprising a first current source transistor arranged in parallel with the first diode coupled transistor and a second current source transistor arranged in parallel with the second diode coupled transistor, the first and second current source transistors operable to provide the output with high impedance in the second state.

12. The circuit of claim 9, further comprising a first switch provided for selectively coupling the first differential output to the first diode coupled transistor and a second switch provided for selectively coupling the second differential output to the second diode coupled transistor.

13. A high gain differential input and output stage circuit for a comparator device without an external feedback, comprising:

a first diode coupled transistor selectively coupleable to a first differential output; and a second diode coupled transistor selectively coupleable to a second differential output;

wherein the first and second diode coupled transistors have a first state coupled to the respective differential outputs for setting the common mode bias output voltage of the stage and a second state alternating between a coupled and a decoupled state from the respective differential outputs for allowing rail to rail output swing during differential mode;

further comprising a first switch provided for selectively coupling the first differential output to the first diode coupled transistor and a second switch provided for selectively coupling the second differential output to the second diode coupled transistor, the first switch being a transistor disposed between a drain and a gate of the first diode coupled transistor and the second switch being a transistor disposed between a drain and a gate of the second diode coupled transistor.

14. The circuit of claim 13, the transistor of the first switch having a source coupled to the gate of the first diode coupled transistor forming a first node and a gate coupled to the second differential output and the transistor of the second switch having a source coupled to the gate of the second diode coupled transistor forming a second node and a gate coupled to the first differential output.

15. The circuit of claim 14, further comprising at least one transistor coupled between the first node and the second node for holding the first node and the second node at a substantially similar potential.

16. The circuit of claim 15, further comprising a first level shifter and comparator circuit coupled to the first common mode setting portion and a second level shifter and comparator circuit coupled to the second common mode setting portion, the first and second level shifter and comparator circuit adapted to prohibit either the first node or the second node from being above a voltage of either the first or second differential outputs.

17. A high gain differential input and output stage circuit for a comparator device without an external feedback, comprising:

means for controlling output bias voltage in common mode, the means for controlling output bias voltage in common mode having a low output impedance; and means for providing a high output impedance during differential mode.

* * * * *